(12) United States Patent
Bergstedt

(10) Patent No.: US 8,822,276 B2
(45) Date of Patent: Sep. 2, 2014

(54) MAGNETIC INTEGRATION DOUBLE-ENDED CONVERTER

(75) Inventor: Leif Bergstedt, Varberg (SE)

(73) Assignee: Huawei Technologies Co., Ltd., Shenzhen (CN)

(*) Notice: Subject to any disclaimer, the term of this patent is extended or adjusted under 35 U.S.C. 154(b) by 177 days.

(21) Appl. No.: 13/493,700

(22) Filed: Jun. 11, 2012

(65) Prior Publication Data

US 2012/0241959 A1  Sep. 27, 2012

Related U.S. Application Data

(63) Continuation of application No. PCT/CN2010/077250, filed on Sep. 25, 2010.

(51) Int. Cl.
*H01L 21/00* (2006.01)
*H01L 23/66* (2006.01)
*H01L 23/482* (2006.01)
*H01L 23/538* (2006.01)
*H01L 23/00* (2006.01)

(52) U.S. Cl.
CPC ... *H01L 23/4822* (2013.01); *H01L 2924/15747* (2013.01); *H01L 2224/92248* (2013.01); *H01L 2924/01082* (2013.01); *H01L 2224/32245* (2013.01); *H01L 2924/01033* (2013.01); *H01L 2924/01047* (2013.01); *H01L 2224/73269* (2013.01); *H01L 2224/45014* (2013.01); *H01L 2223/6605* (2013.01); *H01L 2224/29339* (2013.01); *H01L 23/66* (2013.01); *H01L 2924/15798* (2013.01); *H01L 2924/01079* (2013.01); *H01L 2924/1517* (2013.01); *H01L 2924/15153* (2013.01); *H01L 2224/50* (2013.01); *H01L 24/73* (2013.01); *H01L 2924/01029* (2013.01); *H01L 2224/48091* (2013.01); *H01L 24/29* (2013.01); *H01L 2924/014* (2013.01); *H01L 24/50* (2013.01); *H01L 2224/48472* (2013.01); *H01L 24/48* (2013.01); *H01L 23/5389* (2013.01); *H01L 24/32* (2013.01); *H01L 24/86* (2013.01); *H01L 2224/2929* (2013.01)
USPC ............ 438/118; 438/106; 438/122; 438/123

(58) Field of Classification Search
USPC ................... 438/118, 106, 122, 123
See application file for complete search history.

(56) References Cited

U.S. PATENT DOCUMENTS

| | | | |
|---|---|---|---|
| 4,312,117 A * | 1/1982 | Robillard et al. | ............. 438/107 |
| 5,606,198 A | 2/1997 | Ono et al. | |
| 2002/0109973 A1 | 8/2002 | Utsumi et al. | |

FOREIGN PATENT DOCUMENTS

| | | |
|---|---|---|
| AU | 742589 B2 | 1/2002 |
| CN | 1371127 A | 9/2002 |
| CN | 2777759 Y | 5/2006 |
| CN | 101131944 A | 2/2008 |
| JP | 60062130 A | 4/1985 |
| WO | WO 2012/037728 A1 | 3/2012 |

OTHER PUBLICATIONS

International Search Report issued in corresponding PCT Patent Application No. PCT/CN2010/077250, mailed Jun. 30, 2011.

(Continued)

*Primary Examiner* — Timor Karimy
(74) *Attorney, Agent, or Firm* — Brinks Gilson & Lione

(57) ABSTRACT

The present invention relates to a method of bonding a chip to an external electric circuit. The conductors of the external electric circuit for connection to the chip are formed with physical extensions and the chip is directly bonded to these extensions. The invention also relates to an electric device comprising at least one chip and an external electric circuit. The chip is directly bonded to physical extensions of conductors of the external electric circuit.

5 Claims, 3 Drawing Sheets

(56) References Cited

OTHER PUBLICATIONS

Office Action issued in corresponding Chinese Patent Application No. 201080017350.9, mailed Nov. 28, 2012.

Search Report issued in corresponding Chinese Patent Application No. 201080017350.9, mailed Nov. 28, 2012.

Extended European Search Report issued in corresponding European Patent Application No. 10857442.7, mailed Mar. 1, 2013.

* cited by examiner

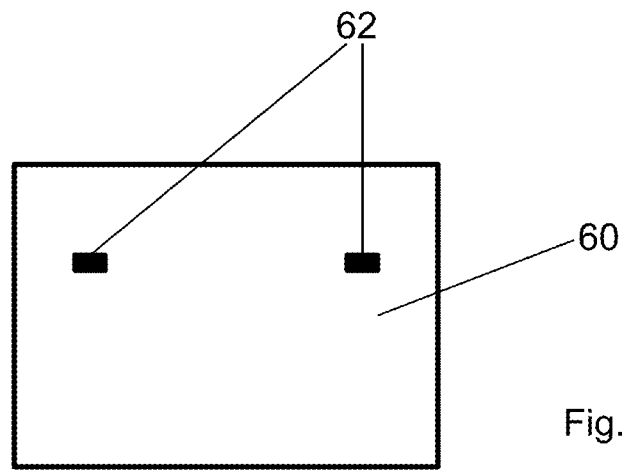
Fig. 6
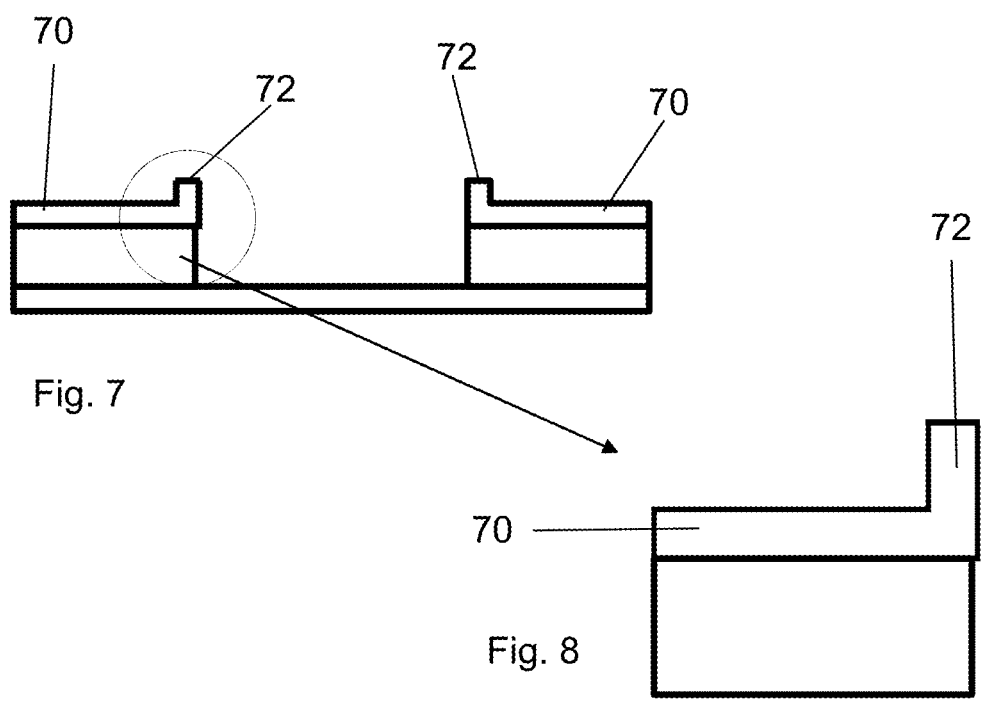
Fig. 7
Fig. 8

MAGNETIC INTEGRATION DOUBLE-ENDED CONVERTER

CROSS-REFERENCE TO RELATED APPLICATIONS

This application is a continuation of International Application No. PCT/CN2010/077250, filed on Sep. 25, 2010, which is hereby incorporated by reference in its entirety.

FIELD OF THE APPLICATION

The present invention relates to a method of bonding a chip to an external electric circuit, and to an electric device comprising at least one chip and an external electric circuit.

BACKGROUND OF THE APPLICATION

Principally there are two common ways of connecting a chip to a carrier like a printed circuit board, viz. wire or ribbon bonding and Flip chip bonding. In wire or ribbon bonding an interconnecting medium in the form of a small wire or ribbon is thermo-compression bonded at its edges to the chip and to a conductor of the electric circuit on the board, respectively. In Flip chip bonding a small solder "bump" is introduced as a connecting medium between the chip and the conductor of the electric circuit.

Thus the general way of interconnecting a chip and an electric circuit on a carrier according to the prior art consists in adding interconnecting material like wires, ribbons or solder bumps.

In wire or ribbon bonding reels of wire or ribbon are attached to a wire or ribbon bonder. Because of the bonding technology the interconnecting wire or ribbon will get a wave-shaped form with a number of curves up and down, as illustrated in FIG. 1. FIG. 1 shows a carrier 2, such as a printed circuit board, and a chip 4 mounted on a ground plate 6. On their upper sides in the figure, the carrier 2 and the chip 4 are provided with conductors 8 and 10 respectively which are interconnected with a wire or ribbon 12 exhibiting curves up and down, as mentioned above. Since the wire or ribbon 12 will not extend up to the edges of the conductors propagating microwaves will have to pass around the edges of the conductors to reach the wire or ribbon 12. This prolonged way for the microwave signals at the interconnection often result in a lacking signal adaptation with increased losses as a result.

The shape of the wire or ribbon 12 will normally be roughly the same at the conductor 8 on the carrier 2 and at the chip conductor 10, although an adapted shape would be preferred.

SUMMARY OF THE DISCLOSURE

By forming conductors of the external electric circuit intended for connection to the chip with physical extensions and directly bond the chip to these extensions, a signal pathway is obtained which is as straight as possible through the interconnection between electric circuit and chip.

Also disclosed is electric device comprising a chip and an external electric circuit, wherein the chip is directly bonded to physical extensions of conductors of the external electric circuit. The bonding element is consequently an integral part of the conductor of the external electric circuit.

BRIEF DESCRIPTION OF THE DRAWINGS

FIG. 6 shows the ground plate.

FIG. 7 shows a carrier with physical conductor extensions at two opposite sides of the cavity for a chip, bent upwards in the Fig. away from the carrier surface to free the opening of the cavity for inserting the chip.

FIG. 8 shows the bending of a conductor extension on a larger scale.

DETAILED DESCRIPTION OF THE EMBODIMENTS

Figure 1:
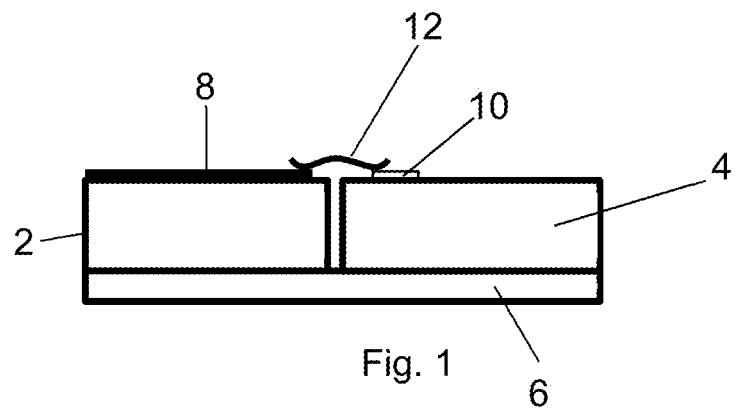
FIG. 1 schematically illustrates wire or ribbon bonding of a chip to an electric circuit board according to prior art.
Figure 2:
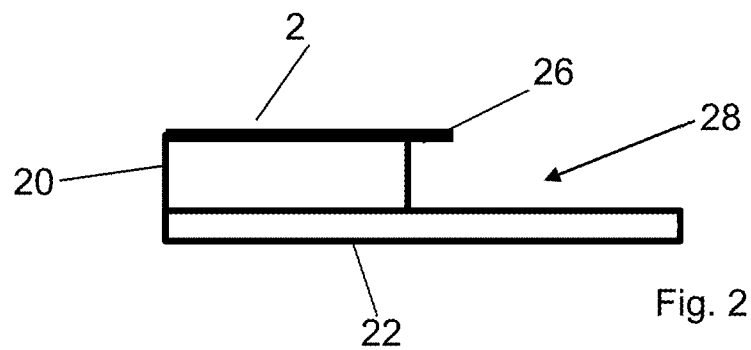
FIG. 2 shows a circuit board or carrier having a conductor extending beyond the board edge and intended for being bonded to a chip.

FIG. 2 shows a carrier, e.g. a printed circuit board, like a mothercard, resting on a ground plate 22 and provided on its upper surface in the figure with a conductive pattern forming an electric circuit with a conductor 24 having a physical extension 26 extending beyond the wall of a cavity 28 formed in the carrier 20 for accommodating a chip. The extension 26 is thus forming a kind of "balcony" in the chip cavity 28. The length of the extension 26, or the "over-hang" of the balcony, is typically 200-300 µm.

Figure 3:
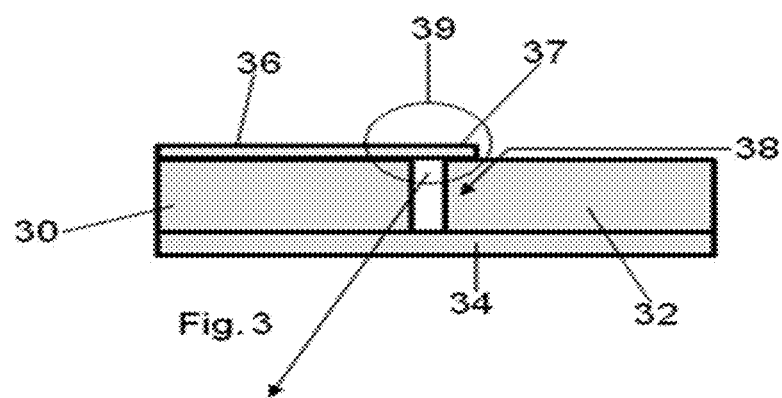
FIG. 3 shows schematically a carrier and a chip on a ground plate interconnected by a conductor on the carrier surface having a physical extension contacting the surface of the chip.

FIG. 3 shows schematically a carrier 30 and a chip 32 on a ground plate 34 interconnected by a conductor 36 on the carrier surface contacting the surface of the chip 32 by a physical conductor extension 37, which is physically the same microstrip conductor is directly bonded to the chip. In the Fig. it is also marked the spot 38 for thermo-compression bonding on the bonding pad at the chip 32. The encircled region 39 in FIG. 3 is shown in greater details on a larger scale in FIG. 4.

Figure 4:
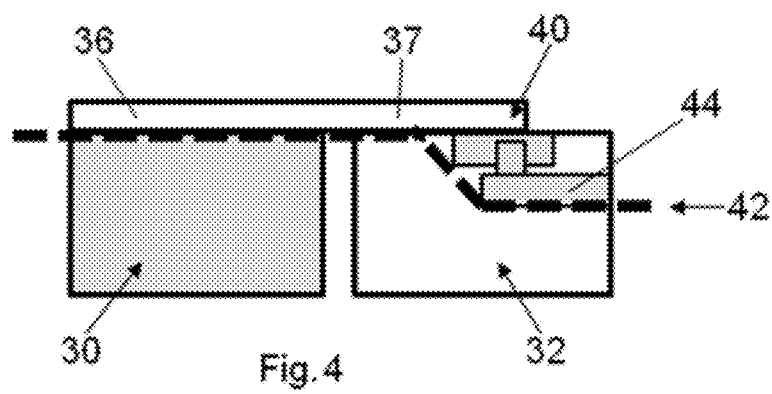
FIG. 4 shows in greater details the bonding of the conductor extension to the chip.

The thermo-compression spot for bonding the conductor extension 37 to a conductor 44 on the chip 32 is indicated at 40 in FIG. 4. The pathway of a microwave signal from a chip conductor 44 through the conductor extension 37 to the carrier conductor 36 of an electric circuit located externally to the chip is shown by the dashed line 42. Since the microwave follows a pathway which is as close as possible to the ground plane it will propagate at the lower side of the same conductor on its way to the bonding pad at the chip 32, and the signal pathway will be as straight as possible through the interconnection between carrier 30 and chip 32 without any round-about ways, as appears from the Fig. With this solution it is also possible to have a flatter bonding as it is not necessary to cut off the bonding element.

Figure 5:
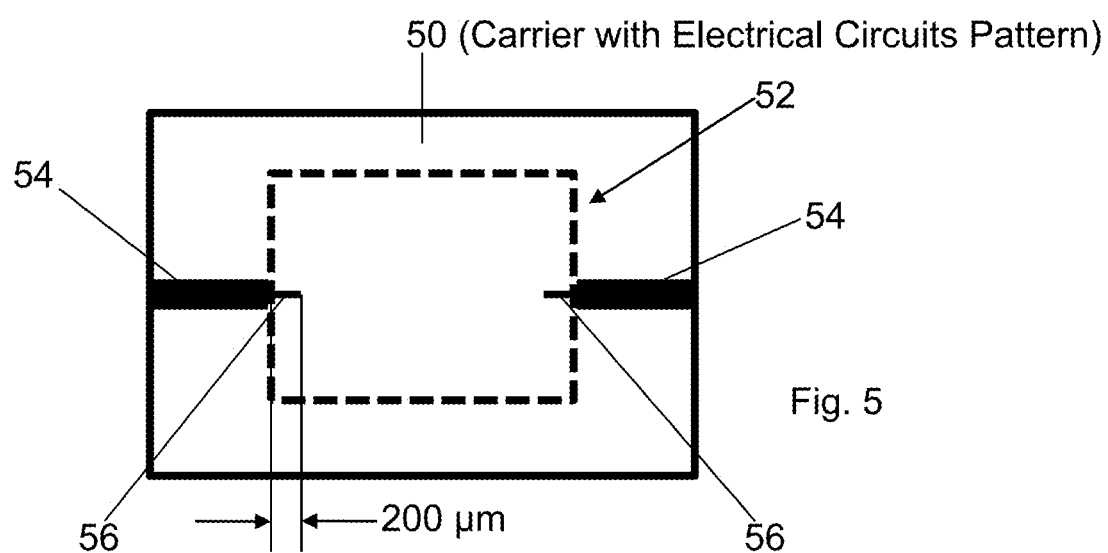
FIG. 5 shows the carrier from the circuit carrying side.

FIG. 5 shows the carrier 50 from the side carrying the electric circuit located externally to the chip. The assumed area for the chip cavity is marked by a dashed line 52. On the carrier surface two oppositely situated conductors 54 are shown having at their ends extensions 56 into the area of the assumed chip cavity. The widths of the conductor extensions 56 are smaller than the widths of the conductors 54 themselves. The shown conductor extensions are primarily designed for microwave signals of frequencies up to 80 GHz, especially for the frequency range of 72-80 GHz. For microwave signal applications there are normally two signal conductors connected to the chip, one "in-connector" and one "out-connector". In addition there can be several other conductors connected to the chip for other purposes, like power supply, etc.

The conductor extensions can have different shapes. The conductor extensions directly bonded to the chip can easily be suitably profiled for different kinds of adaptations. In addition to the described and shown extension shape, the extensions can be e.g. ring-shaped.

In the example shown in FIG. 5 the length of the conductor extensions is indicated to be 200 μm. The gap between chip edge and cavity wall can typically be 50 μm, the distance from chip edge to bond pad edge can be typically 50 μm, the distance from pad edge to the middle of the bond pad can typically amount to 50 μm. A margin of 50 μm then remains. The chip cavity is normally dimensioned such that the chip edges is as tight as possible to the cavity walls on those sides where the conductor extensions are bonded to the chip, whereas the interstices between the other chip edges and cavity walls can be larger.

To form the chip cavity carrier material within the area for the chip cavity is laser cut and burned away, cf. FIG. 5. In the ground plate 60, on the "back side" of the carrier 50, opposite to the carrier side having the external electric circuit, openings 62 are formed at locations corresponding to those of the conductor extensions 56, see FIG. 6. Through these openings 62 carrier material covered by the extensions 56 is reached and laser cut for removal. The openings 62 are etched or drilled and can be made somewhat smaller than the regions covered by the conductor extensions. By using an unfocused laser beam for the laser cutting a larger surface than that of the openings 62 can be reached. Material within an area of typically 100×100 μm or 200×200 μm must be reached for the laser cutting.

The thickness of the conductive sheet on the carrier amounts to 5-40 μm, preferably 18 μm. The conductive sheet consists of copper and the conductor extensions are plated with bondable metal like of AgAu. AgAu plating is a ductile plating allowing bending of the conductor extensions, cf FIG. 7. The most commonly used NiAu plating is very brittle and will break a thin copper conductor.

Before mounting the chip in the chip cavity in the carrier the extensions or balconies 72 of the conductors 70 are bent away from the carrier surface, upwards in FIG. 7, to free the opening of the cavity to make mounting of the chip in the cavity possible. The bending can be performed manually or by a machine. The bent conductor extension 72 is shown on a greater scale in FIG. 8. As illustrated in FIG. 8 it is important that most of the bending is behind the edge of the cavity.

To attach the chip a silver-epoxy glue is used The amount of glue must be quite lean to ensure that very little glue is pressed out of the openings 62 in the ground plate 60, cf FIG. 6. The chip must be positioned very accurately in the cavity. By using hair crosses outside the cavity and an automatic Delvotec die-bonder an accuracy of up to ±5 μm is obtained which actually is an accuracy better than needed. For bonding the chip to the intended conductor on the circuit board a standard ribbon bonder, without ribbon, can be used. The bonding tool will also press down the conductor and conductor extension during the bonding operation, as usually in a bonding process.

In an alternative embodiment of the invention the chip is first placed on a surface. A laminate with etched conductors of the external electric circuit is then positioned on the chip and the chip is bonded to physical extensions of conductors of the electric circuit intended for connection to the chip. The ground plane is then applied and bonded against laminate and chip. In such an embodiment it is neither necessary to have openings in the ground plate for removal of carrier material, nor to bend conductor extensions for positioning the chip in a cavity in the carrier.

In the embodiments described above the bonding technique according to the invention is primarily explained in connection with connections for frequency dependent signals. However, it is obvious that the bonding technique according to the invention is also useful for other kinds of connections to the chip, like connections for power supply and connections for transmission of control signals.

It will be understood that the invention is not restricted to the aforedescribed and illustrated exemplifying embodiments thereof and that modifications can be made within the scope of the invention as defined by the accompanying Claims.

What is claimed is:

1. A method of bonding at least one chip to an external electrical circuit in forming an electrical device, the method comprising:
   etching the external electrical circuit to form conductive printed circuit pattern on a carrier, wherein the carrier comprises a ground plate disposed on a surface opposite from the external electrical circuit;
   forming conductive physical extensions from conductors of the external electrical circuit for connection to the at least one chip, wherein the forming of the conductive physical extensions comprising:
      forming electrical circuit openings on the ground plate at locations corresponding to those of the conductor physical extensions; and
      laser cutting carrier material covered by the conductive physical extensions through the electric circuit openings in order to remove the carrier material directly beneath the conductive physical extensions;
   removing material of the carrier within a predetermined area of the carrier in order to form a cavity such that the conductive physical extensions extend into the cavity;
   positioning the at least one chip into the cavity; and
   directly bonding the at least one chip to the conductive physical extensions.

2. The method according to claim 1, comprising:
   bending the conductive physical extensions away from the carrier surface in order to free the cavity for positioning of the at least one chip; and
      after the positioning of the at least one chip in the cavity, bending the conductive physical extensions towards at least one chip surface; and
   bonding the conductive physical extensions onto the at least one chip.

3. The method according to claim 1, wherein the electrical circuit openings in the ground plate are formed by etching.

4. The method according to claim 1, wherein the electrical circuit openings in the ground plate are formed by drilling.

5. The method according to claim 1, wherein the electrical circuit openings in the ground plate are made smaller than regions of the carrier which are covered by the conductive physical extensions, wherein an unfocused laser beam is used for the laser cutting of remaining carrier material not covered by the conductor extensions.

* * * * *